(12) United States Patent
Kwak et al.

(10) Patent No.: US 6,716,701 B1
(45) Date of Patent: Apr. 6, 2004

(54) METHOD OF MANUFACTURING A SEMICONDUCTOR MEMORY DEVICE

(75) Inventors: Noh Yeal Kwak, Ichon-Shi (KR); Hong Seon Yang, Yongin-Shi (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 0 days.

(21) Appl. No.: 10/601,870

(22) Filed: Jun. 24, 2003

(30) Foreign Application Priority Data

Jul. 18, 2002 (KR) .................................. 10-2002-42153

(51) Int. Cl.$^7$ ........................................... H01L 21/8247

(52) U.S. Cl. ........................ 438/257; 438/263; 438/266

(58) Field of Search ................................. 438/257–266

(56) References Cited

U.S. PATENT DOCUMENTS 6,258,668 B1 * 7/2001 Lee et al. .................... 438/262

* cited by examiner

*Primary Examiner*—H. Jey Tsai
(74) *Attorney, Agent, or Firm*—Jacobson Holman PLLC

(57) ABSTRACT

Disclosed is a method of manufacturing a semiconductor memory device. An ion implantation layer is formed into a given depth of the semiconductor substrate. Therefore, it is possible to prevent the dopant (P31) gettered on the surface of the semiconductor substrate from being diffused toward the bottom when a well ion is injected. The dopant (P31) gettered on the surface of the semiconductor substrate is easily experienced by transit-enhanced diffusion even at low temperature. Also, the dopant may serve as counter dopping in the buried channel. In the present invention, as the behavior of this dopant (P31) is prohibited in a subsequent annealing process, the concentration of the ion for controlling the threshold voltage could be uniformly kept. Therefore, the present invention can manufacture devices of high reliability having a stable threshold voltage characteristic and can be flexibly applied to manufacturing the devices depending on reduction in the design rule.

11 Claims, 6 Drawing Sheets

METHOD OF MANUFACTURING A SEMICONDUCTOR MEMORY DEVICE

BACKGROUND OF THE INVENTION

1. Field of the Invention

The present invention relates to a method of manufacturing a semiconductor memory device, and more particularly, to a method of manufacturing a semiconductor memory device capable of stably keeping the threshold voltage of the flash memory device.

2. Background of the Related Art

In general, a flash memory device comprises a memory cell array for storing data and a peripheral circuit for storing/reading data at/from the memory cell array. Each of the memory cells formed in the memory cell region includes a gate of a structure on which a tunnel oxide film, a floating gate, a dielectric film and a control gate are stacked, and the source and the drain formed at both sides of the gate. The memory cell is programmed as hot electrons are injected into the floating gate. Also, the memory cell is erased as the injected electrons are discharged.

The data retention ability of the flash memory cell constructed above, is decided by the dielectric constant of the dielectric film formed between the floating gate and the control gate. Accordingly, in order to obtain a high dielectric constant, a deposition process is implemented at high temperature so that the dielectric film of a high density is formed. If the process is performed at high temperature as above, however, many problems relating to characteristics of the device occur. In particular, as the threshold voltage of the transistor is changed, it adversely affects the reliability of the device.

A common CMOS device using a P type substrate has wells into which different dopants are injected. A P type dopant is injected into the channel regions of the NMOS and PMOS transistors, which are formed in their respective wells, in order to control the threshold voltage. In case of the PMOS transistor, however, it is experienced by several high-temperature annealing processes in its manufacture process. Therefore, the depletion layer is increased at a buried channel due to transient enhanced diffusion (TED) of the dopant injected into the source and the drain, which makes low the threshold voltage. Such reduction in the threshold voltage occurs over the entire wafer regions. Accordingly, there is a difficulty that the depth of the junction must be further shallow in order to stabilize the threshold voltage.

Conventionally, a trench of a shallow size is formed in the substrate using the pad oxide film and the pad nitride film as a mask. An isolation film is then formed within the trench. After wells are formed in order to form a CMOS device, a P type ion for threshold voltage control is injected in order to control the threshold voltage of the transistor that will be formed in every region. At this time, in case of the NMOS transistor, B11 ion is injected. In case of a PMOS transistor having the buried channel, $BF_2$ ion is injected in order to make the depth of the channel shallow. Thereafter, a tunnel oxide film and a polysilicon layer are formed over the semiconductor substrate in the memory cell region and the peripheral circuit region. Next, a dielectric film having an ONO (oxide/nitride/oxide) structure is formed by means of a low-pressure chemical vapor deposition (LPCVD) method. After a mask is formed in the memory cell region, the dielectric film, the polysilicon layer and the tunnel oxide film, in the exposed peripheral circuit region, are removed.

In order to form gates of a high-voltage transistor and a low-voltage transistor over the semiconductor substrate in the peripheral circuit region, a gate oxide film and a polysilicon layer are formed. Subsequent processes are same to common manufacture processes of the flash memory devices.

If the mentioned conventional manufacture method is utilized, the P type dopant injected in order to control the threshold voltage is experienced by TED in a subsequent annealing process. Therefore, the concentration of the ion in the channel region is reduced and the threshold voltage is changed accordingly.

FIG. 1A shows the result of measuring the threshold voltage in the SRAM for which annealing steps at high temperature is little. FIG. 1B shows the result of measuring the threshold voltage in the flash memory device for which annealing steps at high temperature is many. In case of the SRAM, it could be seen that change in the threshold voltage is small both in case that the pattern is big (line A) and in case of a real size (line B). However, in case of the flash memory devices, it can be seen that variation in the threshold voltage is large. Further, in case of the flash memory devices, it could be seen that the threshold voltage over the entire wafer regions is irregularly distributed, as shown in FIG. 2

Such variation and irregular distribution in the threshold voltage greatly affects the reliability of the device. In particular, it makes difficult implementing a transistor having a stable electrical characteristic.

SUMMARY OF THE INVENTION

Accordingly, the present invention is contrived to substantially obviate one or more problems due to limitations and disadvantages of the related art, and an object of the present invention is to provide a method of manufacturing semiconductor memory devices, by which an ion implantation layer is formed in a given depth of a semiconductor substrate, thereby preventing transit enhanced diffusion of a dopant that was gettered on the semiconductor substrate upon implantation of the ion into the well.

In a preferred embodiment, the method of manufacturing the semiconductor memory devices according to the present invention is characterized in that it comprises the steps of forming a trench in an isolation region of a semiconductor substrate and then forming an isolation film within the trench, forming a screen oxide film on the semiconductor substrate and then forming a triple well through an ion implantation process using a given mask, removing the screen oxide film, forming a tunnel oxide film and a first polysilicon layer on the entire structure and then patterning the first polysilicon layer to form a floating gate over the semiconductor substrate in the memory cell region, forming a dielectric film and a second polysilicon layer on the entire structure and then patterning the second polysilicon layer to form a control gate over the semiconductor substrate in the memory cell region, injecting an ion for controlling the threshold voltage into the exposed semiconductor substrate of the peripheral circuit region, and forming a gate oxide film and a third polysilicon layer over the semiconductor substrate of the peripheral circuit region, thus forming a gate of a transistor.

The method further comprises the step of after the step of forming the triple well, injecting an inert ion into a given depth of the semiconductor substrate and then implementing a rapid thermal process to form an ion implantation layer. The inert ion is nitrogen ($N_2$) and is injected with energy of 30~100 KeV at the dose of 1E13~5E14 ion/cm$^2$. The rapid thermal process is implemented under nitrogen (N$_2$) atmosphere at a temperature of 900~1100° C. for 5~30 seconds.

The ion for controlling the threshold voltage is BF$_2$ and is injected with energy of 10~50 KeV at the dose of 1E11~1E14 ion/cm$^2$.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

In another aspect of the present invention, it is to be understood that both the foregoing general description and the following detailed description of the present invention are exemplary and explanatory and are intended to provide further explanation of the invention as claimed.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Figure 1A:
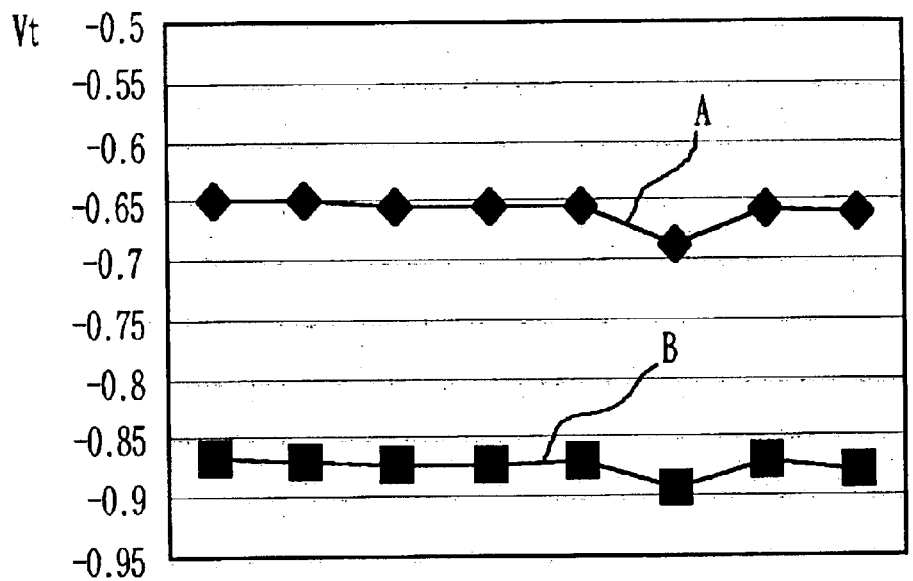
FIG. 1A and FIG. 1B graphs showing measurement of the threshold voltage in a conventional semiconductor memory device.
Figure 1B:
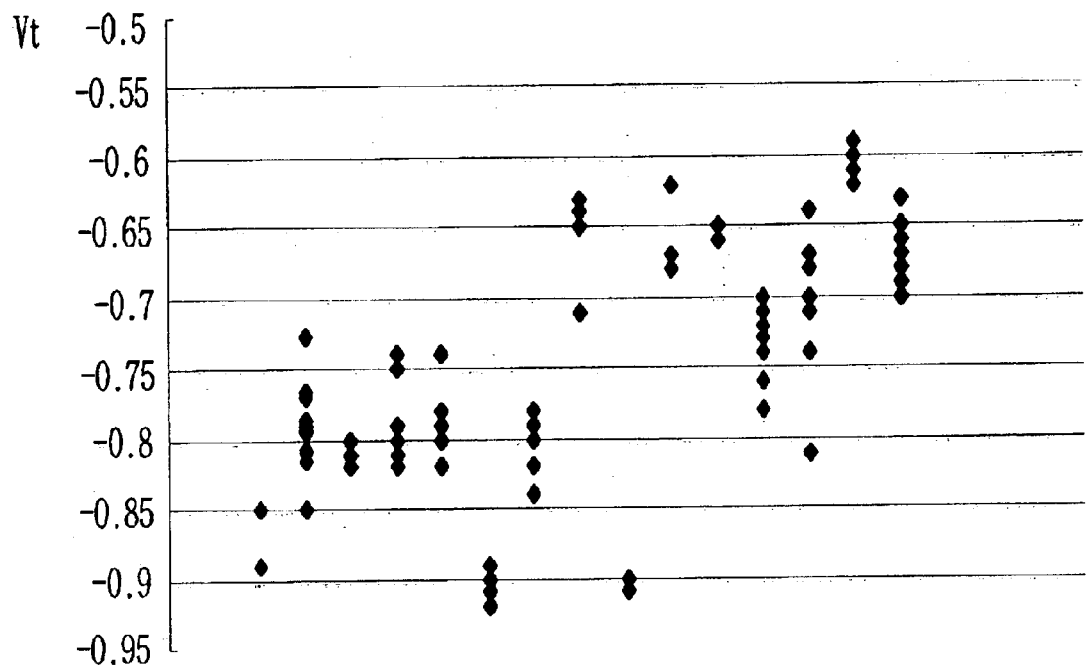
Figure 2:
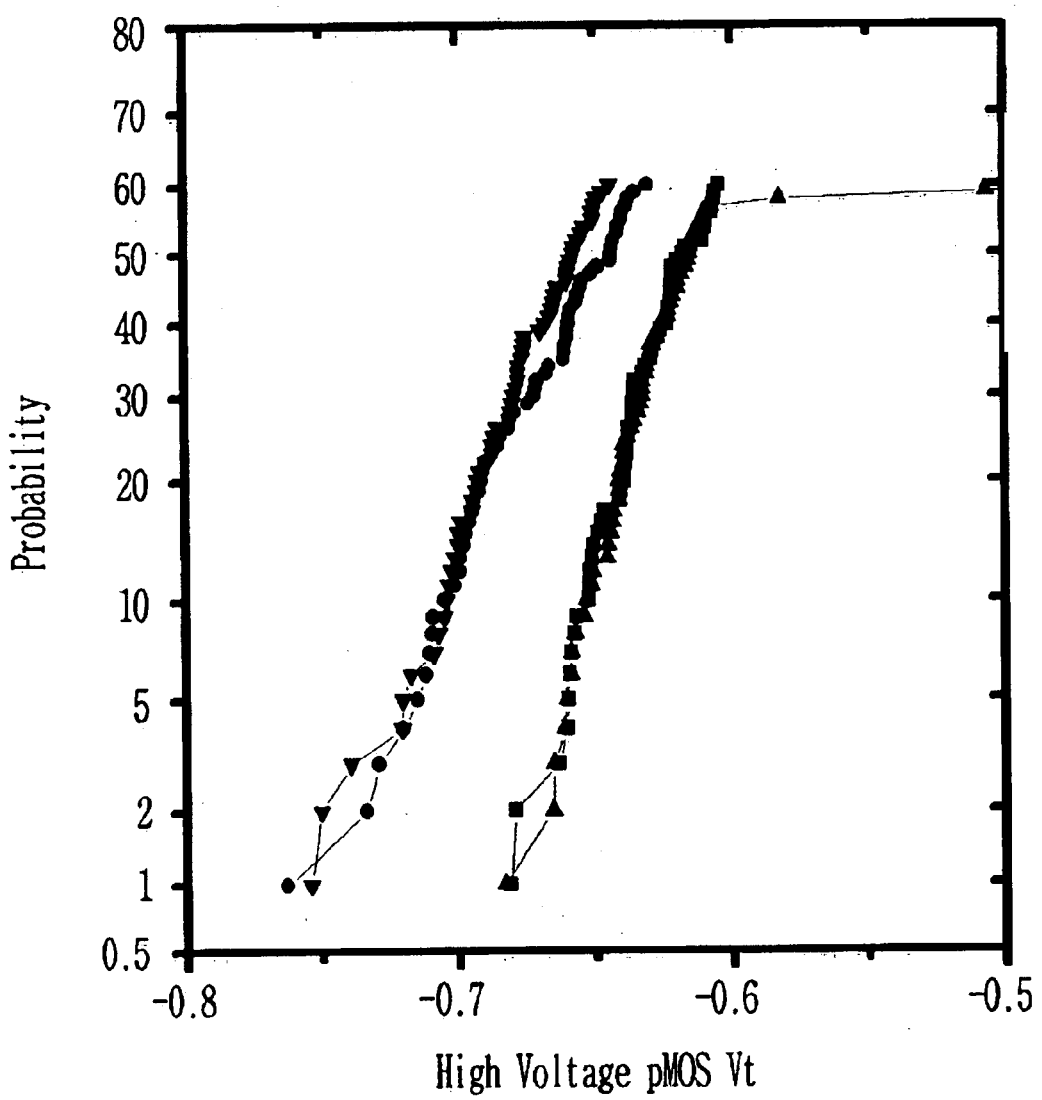
FIG. 2 is a graph showing measurement of the threshold voltage in the entire regions of the wafer.

Reference will now be made in detail to the preferred embodiments of the present invention, examples of which are illustrated in the accompanying drawings, in which like reference numerals are used to identify the same or similar parts.

FIG. 3A~FIG. 3H are cross-sectional view of flash memory devices according to a preferred embodiment of the present invention.

Figure 3A:
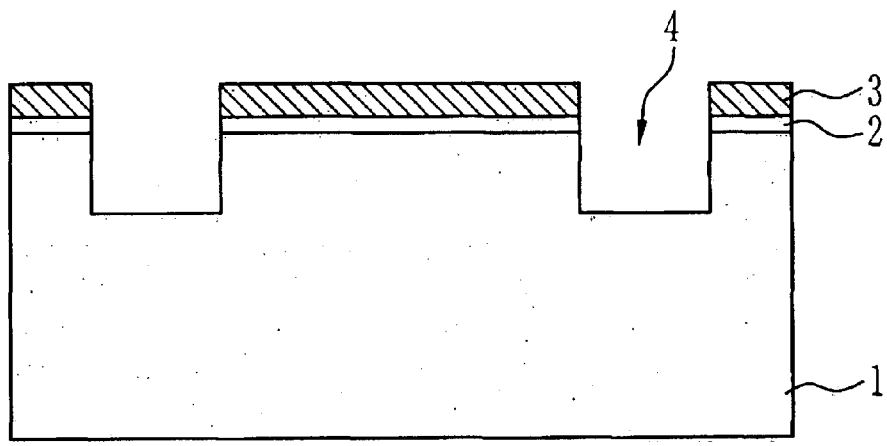
FIG. 3A~FIG. 3H are cross-sectional view of flash memory devices according to a preferred embodiment of the present invention.

Referring now to FIG. 3A, a pad oxide film 2 and a pad nitride film 3 are sequentially formed on a semiconductor substrate 1 in a memory cell region and a peripheral circuit region. The pad oxide film 2 and the pad nitride film 3 are then patterned using the isolation mask. Next, the semiconductor substrate 1 at the exposed portion is etched by a given depth, thus forming a trench 4 of a shallow size.

Figure 3B:
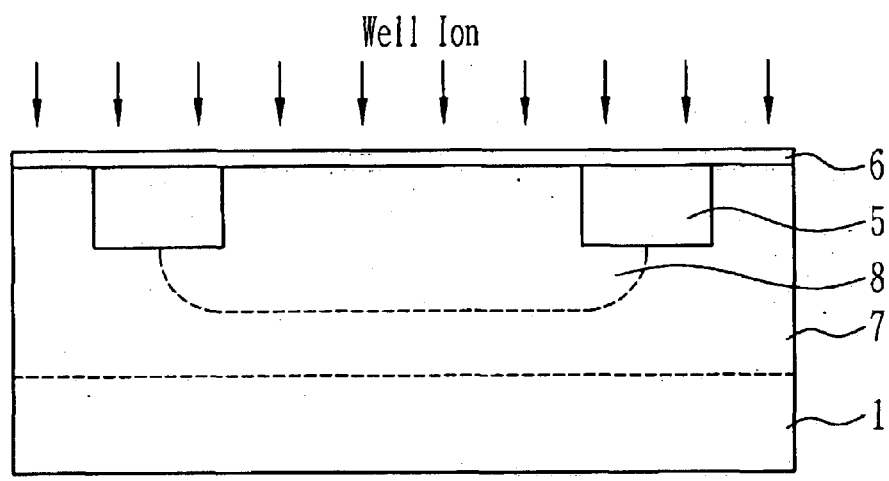
Figure 4:
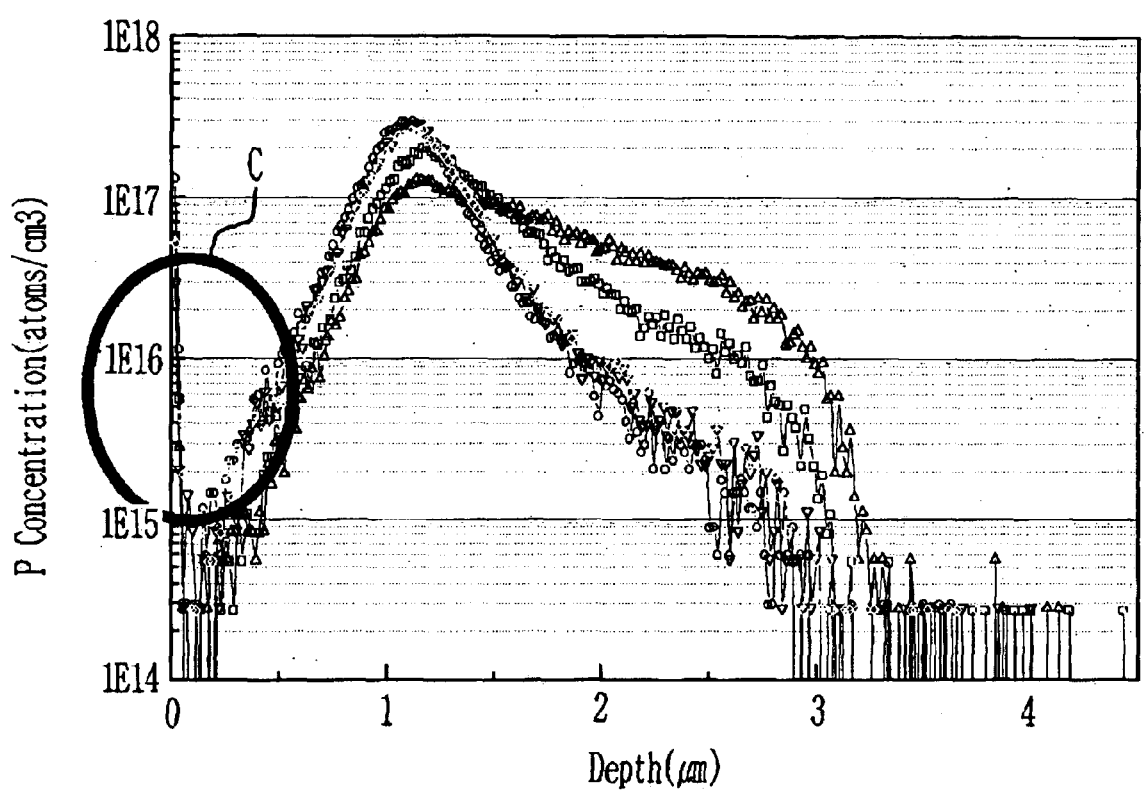
FIG. 4 is a graph for explaining the present invention.

By reference to FIG. 3B, an oxide film is formed on the entire structure so that the trench 4 is buried, and is then planarized. Next, remaining pad nitride film 3 and the pad oxide film 2 are then removed to form an isolation film 5 within the trench 4. Thereafter, in order to form a triple well in a region where a PMOS transistor will be formed, a screen oxide film 6 is formed on the entire surface. An ion implantation process using a given mask is then performed to form a triple N well 7 and an N well 8. At this time, as shown in FIG. 4, the dopant of a given amount (P31) is gettered on the surface of the semiconductor substrate 1. As the amount of the ion gettered is a lot as indicated by C, it may serve as counter doping when an ion (BF$_2$) for controlling the threshold voltage is injected.

In the above, the triple N well 7 is formed by injecting a dopant (P31) having the dose of 5E12~5E13 ion/cm$^2$ with energy of 1000~2000 KeV. The N well 8 is formed by injecting the dopant (P31) having the dose of 5E12~5E13 ion/cm$^2$ with energy of 500~1000 KeV. At this time, it is preferred that the dopant is injected at a tilt angle of 3~10° so that channeling of the dopant can be prevented.

Figure 3C:
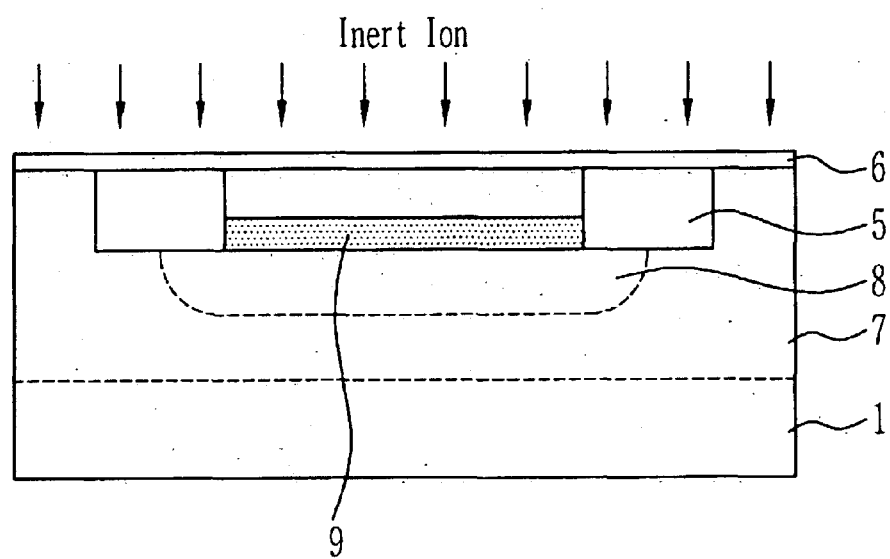

Referring to FIG. 3C, an inert ion is injected into a given depth of the semiconductor substrate 1. The ions injected into the wells 7 and 8 are then activated and is also experienced by a rapid thermal process so that behavior of the inert ion is prohibited. Thereby, an ion implantation layer 9 where the inert ion is injected into the given depth of the semiconductor substrate 1 is formed. At this time, the ion implantation layer 9 serves to prevent the dopant (P31) gettered on the surface of the semiconductor substrate 1 from being diffused toward the bottom in a subsequent annealing process.

The inert ion may include nitrogen (N$_2$) and is injected with energy of 30~100 KeV so that the dopant (P31) gettered on the surface of the semiconductor substrate 1 is injected into the bottom. At this time, the dose is controlled to be 1E13~5E14 ion/cm$^2$ so that the semiconductor substrate 1 is not made amorphous. Also, the dose is injected at a tilt angle of 3~10° so that channeling of the dopant is prevented.

The rapid thermal process is implemented under N$_2$ atmosphere at a temperature of 900~1100° C. for 5~30 seconds. At this time, the lamp-up ratio is controlled to be 50~100° C./sec.

Figure 3D:
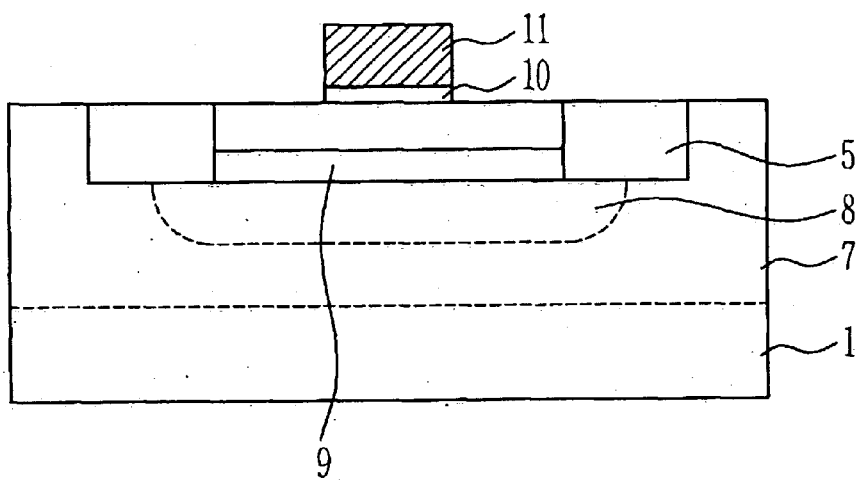

Referring now to FIG. 3D, the screen oxide film 6 is removed. A tunnel oxide film 10 and a polysilicon layer 11 are then sequentially formed on the surface from which the screen oxide film 6 is removed. Next, the polysilicon layer 11 are patterned to form a floating gate 11 over the semiconductor substrate 1 in the memory cell region. At this time, the tunnel oxide film 10 and the polysilicon layer 11 in the peripheral circuit region are removed during the patterning process for forming the floating gate 11.

The surface of the semiconductor substrate 1 is cleaned using a dilute HF and SC-1 solution before the tunnel oxide film 10 is formed. The tunnel oxide film 10 is then formed by means of a wet oxidization process using hydrogen (H$_2$) and oxygen (O$_2$) at a temperature of 750~800° C. Then, doped polysilicon is deposited in thickness of over 700 Å by means of the low-pressure chemical vapor deposition (LPCVD) method using silicon source gas such as SiH$_4$ or Si$_2$H$_6$ and POCl$_3$ or PH$_3$ gas at a temperature of 510~550° C. and a pressure of 0.1~3.0 Torr, thereby forming the polysilicon layer 11.

Figure 3E:
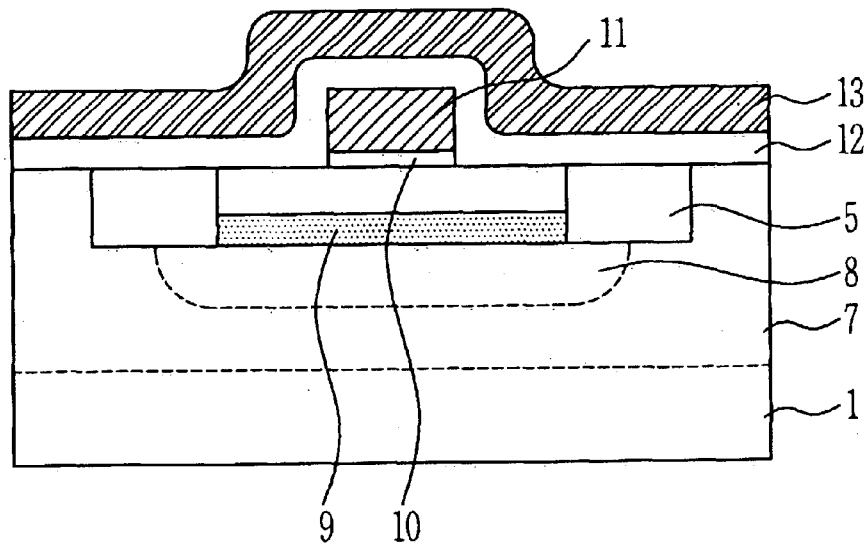
Figure 3F:
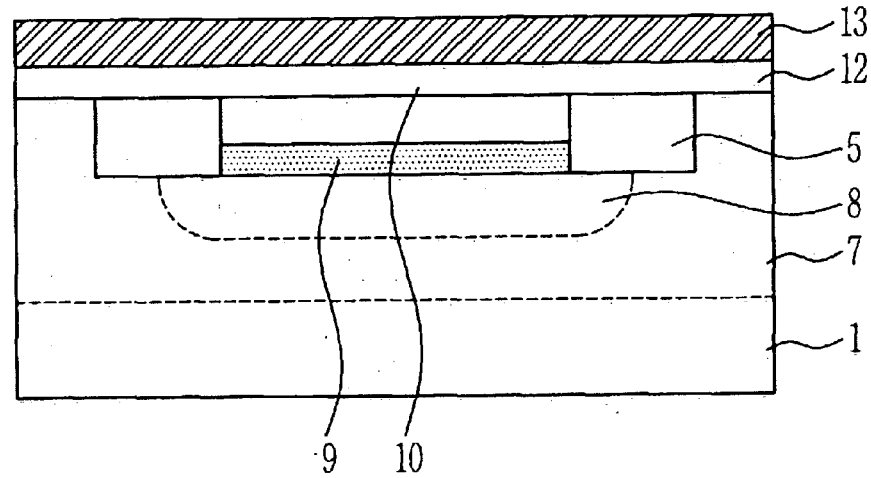

By reference to FIG. 3E and FIG. 3F, a dielectric film 12 of an ONO (bottom oxide film/nitride film/top oxide film) structure, and a polysilicon layer 13 to be used as a control gate are sequentially formed. At this time, the dielectric film 12 is formed at high temperature so that it has a high density. FIG. 3E shows the memory cell region and FIG. 3F shows the peripheral circuit region.

The bottom oxide film and the top oxide film in the ONO structure are formed by means of the low-pressure chemical vapor deposition (LPCVD) method using DCS (SiH$_2$Cl$_2$) and N$_2$O (or NO) gas as source at a temperature of 810~850° C. and a low pressure of below 1~3 Torr. Also, the nitride film in the ONO structure is formed by means of the low-pressure chemical vapor deposition (LPCVD) method using $Si_3N_4$ and $N_2O$ (or NO) gas as s source at a temperature of 810~850° C. and a low pressure of below 1~3 Torr.

Further, the polysilicon layer 13 is formed by means of the low-pressure chemical vapor deposition (LPCVD) method using silicon source gas such as $SiH_4$ or $Si_2H_6$ and $PH_3$ gas as source at a temperature of 530~550° C. and a low pressure of below 1~3 Torr.

Figure 3G:
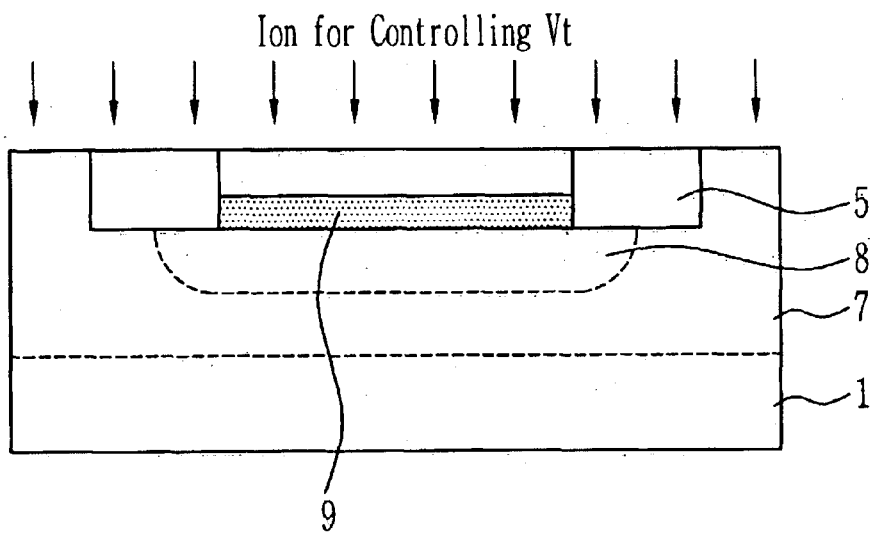

Referring to FIG. 3G, a mask is formed in the memory cell region. The dielectric film 12 and the polysilicon layer 13 in the exposed peripheral circuit region are then removed. In order to form a buried channel, an ion for controlling the threshold voltage (Vt) is thinly injected into the semiconductor substrate 1 in the peripheral circuit region where the PMOS transistor will be formed.

The ion for controlling the threshold voltage (Vt) may include $BF_2$ of a high mass as a P type dopant and is injected with energy of 10~50 KeV at the dose of 1E11~1E14 ion/cm$^2$. At this time, the ion is injected at a tilt angle of 3~10° so that channeling of the dopant is prevented.

Figure 3H:
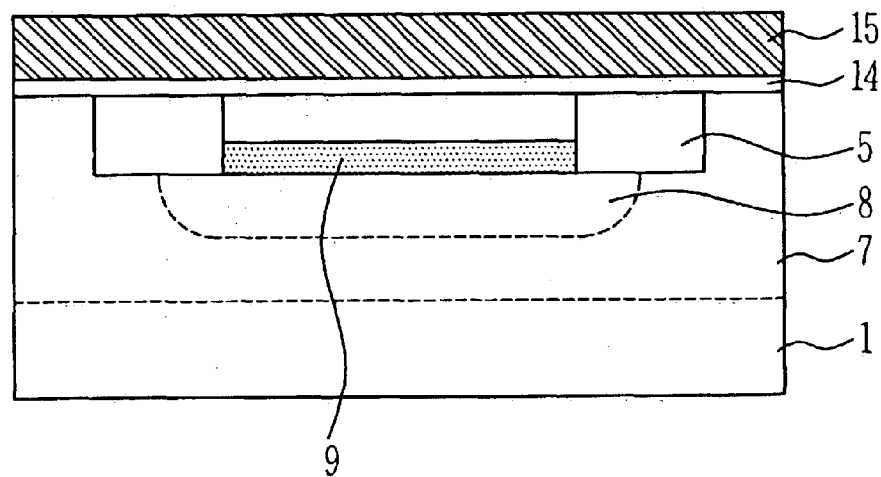

Referring to FIG. 3H, in order to form a high-voltage transistor and a low-voltage transistor in the peripheral circuit region, a gate oxide film 14 and a polysilicon layer 15 are sequentially formed on the semiconductor substrate 1 in FIG. 3G. Next, the polysilicon layer 15 and the gate oxide film 14 are patterned photography and etch process using the gate mask, thus forming a gate electrode of the transistor. At this time, the thickness of the gate oxide films 14 in the high-voltage transistor and the low-voltage transistor is different.

Thereafter, subsequent processes are same to common processes of manufacturing the flash memory devices.

As described above, according to the present invention, the ion implantation layer is formed into a given depth of the semiconductor substrate. Therefore, the present invention can have an advantageous effect that it can prevent the dopant (P31) gettered on the surface of the semiconductor substrate from being diffused toward the bottom when a well ion is injected. The dopant (P31) gettered on the surface of the semiconductor substrate is easily experienced by transit-enhanced diffusion even at low temperature. Also, the dopant may serve as counter dopping in the buried channel. In the present invention, as the behavior of this dopant (P31) is prohibited in a subsequent annealing process, the concentration of the ion for controlling the threshold voltage could be uniformly kept. Therefore, the present invention can have advantageous effects that it can manufacture devices of high reliability having a stable threshold voltage characteristic and be flexibly applied to manufacturing the devices depending on reduction in the design rule.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of manufacturing a semiconductor memory device, comprising the steps of:

forming a trench in an isolation region of a semiconductor substrate and then forming an isolation film within the trench;

forming a screen oxide film on the semiconductor substrate and then forming a triple weal through an ion implantation process using a given mask;

removing the screen oxide film, forming a tunnel oxide film and a first polysilicon layer on the entire structure and then patterning the first polysilicon layer to form a floating gate over the semiconductor substrate in the memory cell region;

forming a dielectric film and a second polysilicon layer on the entire structure and then patterning the second polysilicon layer to form a control gate over the semiconductor substrate in the memory cell region;

injecting an ion for controlling the threshold voltage into the exposed semiconductor substrate of the peripheral circuit region; and forming a gate oxide film and a third polysilicon layer over the semiconductor substrate of the peripheral circuit region, thus forming a gate of a transistor.

2. The method as claimed in claim 1, wherein the triple well includes a triple N well and an N well formed within the triple N well.

3. The method as claimed in claim 2, wherein the triple N well is formed by injecting P31 having the dose of 5E12~5E13 ion/cm$^2$ with energy of 1000~2000 KeV and the N well is formed by injecting P3 having the dose of 5E12~5E13 ion/cm$^2$ with energy of 500~1000 KeV.

4. The method as claimed in claim 1, further comprising the step of after the step of forming the triple well, injecting an inert ion into a given depth of the semiconductor substrate and then implementing a rapid thermal process to form an ion implantation layer.

5. The method as claimed in claim 4, wherein the inert ion is nitrogen ($N_2$) and is injected with energy of 30~100 KeV ad the dose of 1E13~5E14 ion/cm$^2$.

6. The method as claimed in claim 4, wherein the rapid thermal process is implemented under nitrogen ($N_2$) atmosphere at a temperature of 900~1100° C. for 5~30 seconds.

7. The method as claimed in claim 1, further comprising the step of before the tunnel oxide film is formed, cleaning the surface of the semiconductor substrate using a dilute HF and SC-1 solution.

8. The method as claimed in claim 1, wherein the tunnel oxide film is formed by means of a wet oxidization process using hydrogen ($H_2$) and oxygen ($O_2$) at a temperature of 750~800° C.

9. The method as claimed in claim 1, wherein the first polysilicon layer is formed by means of a low-pressure chemical vapor deposition method using silicon source gas such as $SiH_4$ or $Si_2H_6$ and $POCl_3$ or $PH_3$ gas at a temperature of 510~550°0 C. and a pressure of 0.1~3.0 Torr.

10. The method as claimed in claim 1, wherein the second polysilicon layer is formed by means of a low-pressure chemical vapor deposition method using silicon source gas such as $SiH_4$ or $Si_2H_6$ and $PH_3$ gas at a temperature of 530~550° C. and a pressure of below 1 Torr.

11. The method as claimed in claim 1, wherein the ion for controlling the threshold voltage is $BF_2$ and is injected with energy of 10~50 KeV at the dose of 1E11~1E14 ion/cm$^2$.

* * * * *